(12) United States Patent
Ho et al.

(10) Patent No.: US 8,887,116 B2
(45) Date of Patent: Nov. 11, 2014

(54) FLEXIBLE PATTERN-ORIENTED 3D PROFILE FOR ADVANCED PROCESS NODES

(71) Applicant: Taiwan Semiconductor Manufacturing Co., Ltd., Hsin-Chu (TW)

(72) Inventors: Chia-Ming Ho, Hsinchu (TW); Te-Yu Liu, Xinpu Township (TW); Austin Chingyu Chiang, New Taipei (TW); Meng-Fan Wu, Keelung (TW); Ke-Ying Su, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/906,614

(22) Filed: May 31, 2013

(65) Prior Publication Data

US 2014/0282341 A1    Sep. 18, 2014

Related U.S. Application Data

(60) Provisional application No. 61/782,815, filed on Mar. 14, 2013.

(51) Int. Cl.
*G06F 17/50* (2006.01)
(52) U.S. Cl.
CPC ................... *G06F 17/5072* (2013.01)
USPC .......................................... 716/122; 716/123
(58) Field of Classification Search
USPC ................................................ 716/120–126
See application file for complete search history.

(56) References Cited

U.S. PATENT DOCUMENTS 6,438,729 B1 * 8/2002 Ho ................................ 716/113
2007/0044060 A1 * 2/2007 Waller ............................ 716/13

* cited by examiner

*Primary Examiner* — Binh Tat
(74) *Attorney, Agent, or Firm* — Eschweiler & Associates, LLC

(57) ABSTRACT

The present disclosure relates to a method of RC extraction that provides for a fast development time and easy maintenance. In some embodiments, the method provides a graphical representation of an integrated chip layout having a plurality of integrated chip components. A plurality of pattern based graphical features are then determined. Respective pattern based graphical features define a structural aspect of an integrated chip component. One of the plurality of integrated chip components is defined as a pattern oriented function having inputs of one or more of the pattern based graphical features. The pattern oriented function determines a shape of the one of the plurality of integrated chip components based upon a relation between the plurality of inputs. By determining a shape of an integrated chip component using a pattern oriented function, the complexity of RC profiles can be reduced.

22 Claims, 5 Drawing Sheets

US 8,887,116 B2

FLEXIBLE PATTERN-ORIENTED 3D PROFILE FOR ADVANCED PROCESS NODES

REFERENCE TO RELATED APPLICATIONS

This application claims priority to U.S. Provisional Patent Application Ser. No. 61/782,815 filed on Mar. 14, 2013, entitled "Flexible Pattern-Oriented 3D Profile For Advanced Process Nodes", which is hereby incorporated in its entirety.

BACKGROUND

Integrated chips comprise millions of transistor devices. The transistor devices are connected to one another by way of conductive metal interconnects. The metal interconnects have an associated capacitance and resistance, which impacts chip parameters such as signal delay, energy consumption, etc. Therefore, during integrated chip development parasitic extraction of resistive and capacitive (RC) components may be used in conjunction with modeling and timing analysis to describe the performance of an integrated chip.

In prior technology nodes (e.g., 90 nm, 130 nm, etc.), the capacitive and resistive effects of interconnect wires in larger integrated chip designs could be addressed using approximate methods such as pre-characterization of devices and 2.5 D extraction without appreciable loss of accuracy. However, as the size of integrated chip components has decreased RC effects have had an increasing impact on chip parameters. In advanced semiconductor technology nodes (e.g., 22 nm node, 14 nm node, etc.) RC parasitics have a large effect on chip parameters, such that accurate RC parasitic modeling is necessary for proper IC modeling. However, more accurate RC extraction methods (e.g., 3D extraction) are complex and pose a number of limitations for extraction of large-scale designs.

DETAILED DESCRIPTION

Figure 1:
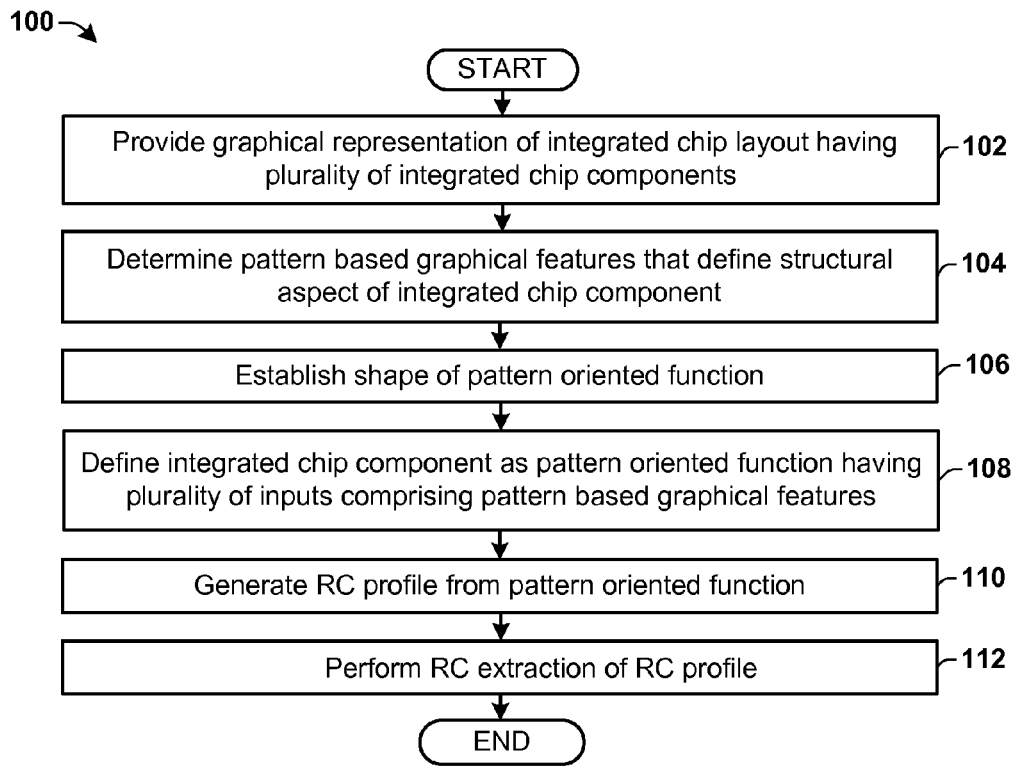
FIG. 1 is a flow diagram of some embodiments of a method of performing an RC extraction.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It will be appreciated that the details of the figures are not intended to limit the disclosure, but rather are non-limiting embodiments. For example, it may be evident, however, to one of ordinary skill in the art, that one or more aspects described herein may be practiced with a lesser degree of these specific details. In other instances, known structures and devices are shown in block diagram form to facilitate understanding.

To improve the quality of device modeling in advanced process nodes, extrinsic interconnect parasitic models may be removed from device models. Therefore, middle-of-the-line (MEOL) components, such as gate contacts, gate structures, block structures, etc., may become a part of interconnect parasitic (RC) extraction. However, RC profiles used to describe MEOL components are often more complex than those used in prior extraction methods. For example, MEOL components may be described using complex 3D RC profiles. Due to the complexity of the 3D profiles, generating and/or tuning (i.e., updating) the profiles in an RC deck is a time consuming process that is often impractical for large designs.

Accordingly, the present disclosure relates to a method of RC extraction that provides for fast development time and easy maintenance. In some embodiments, the method comprises generating a graphical representation of an integrated chip layout having a plurality of integrated chip components. A plurality of pattern based graphical features are then determined. Respective pattern based graphical features define a structural aspect of an integrated chip component. One of the plurality of integrated chip components is defined as a pattern oriented function having a plurality of inputs comprising one or more of the pattern based graphical features. The pattern oriented function is configured to determine a shape of the one of the plurality of integrated chip components based upon a relation between the plurality of inputs. By determining a shape of an integrated chip component using a pattern oriented function, the complexity of RC profiles can be reduced, thereby simplifying an RC deck and improving development and maintenance time.

FIG. 1 is a flow diagram of some embodiments of a method 100 of performing an RC extraction.

At 102, a graphical representation of an integrated chip layout is provided. The graphical representation of the integrated chip layout comprises a plurality of integrated chip components that are to be formed on a semiconductor substrate. In some embodiments, the graphical representation of the integrated chip may comprise a GDS file, for example. In some embodiments, the graphical representation may comprise middle-of-the-line (MEOL) design levels, such as gate structures (e.g., gate poly) design levels, blocking design levels (i.e., blocking structures), and/or gate contact design levels that traditionally have complex RC profiles. In other embodiments, the graphical representation may comprise other design levels such as back-end-of-the-line metal interconnect layers, for example.

At 104, one or more pattern based graphical features are determined that define structural aspects of an integrated chip component. For example, a pattern based graphical feature may comprise a width of a contact or an associated height. In some embodiments, the pattern based graphical features comprise a scalar value that defines a structural aspect of an integrated chip component. In some embodiments, the pattern based graphical features are interrelated to one another in a manner such that the interrelation describes a physical structure of an integrated chip component.

In some embodiments, the pattern based graphical features have a spatial relation with vertices of an integrated chip component. Since respective vertices are located along an outer edge of the integrated chip component, the interrelation between the vertices allow for the pattern based graphical features to accurately define a shape of the integrated chip component. Because vertices are located between the intersection of two sides of the integrated chip component, the vertices allow for the position of sides between two vertices to be determined to model an integrated chip component. For example, first and second adjacent vertices are interrelated in such a manner that allow the function to determine a side of the integrated chip component between the first and second vertices.

At 106, a shape of the pattern oriented function may be determined. The shape of the pattern oriented function determines how a pattern oriented function operates to define an integrated chip component. For example, in some embodiments the shape may comprise an outer shape that defines the shape in terms of a pattern oriented function. In other embodiments, the shape may comprise an inner shape that defines the shape by subtracting an area defined in terms of a pattern oriented function. In some embodiments, the shape of the pattern oriented function may be determined from vertex information of the integrated chip component to be defined.

In some embodiments, pattern oriented functions may be pre-defined for a plurality of different shapes. The pre-defined pattern oriented functions may be stored in a database and accessed depending upon a selected shape. For example, in some embodiments the shape of an integrated chip component may be determined to be one of a plurality of shape categories corresponding to pattern oriented functions stored in the database.

In some embodiments, pattern oriented functions corresponding to shapes may be pre-defined for a plurality of different integrated chip components. For example, a first pattern oriented function corresponding to a first shape may be defined for gate contacts, a second pattern oriented function corresponding to a second shape may be defined for gate structures, etc. Once the pattern oriented functions have been defined, an RC profile for an integrated chip component may be generated by inputting patterned based graphical features into a pre-defined pattern oriented function, as described below.

At 108, an integrated chip component is defined as a pattern oriented function having inputs comprising pattern based graphical features. The pattern oriented function is configured to determine a shape of the one of the plurality of integrated chip components based upon a relation between the plurality of inputs. The output of the pattern oriented function describes the determined shape.

At 110, an RC profile for an integrated chip component is generated from a pattern oriented function that describes the integrated chip component. In some embodiments, acts 102-110 may be repeated to form an RC deck comprising a plurality of RC profiles comprising pattern oriented functions.

At 112, an RC extraction is performed on the RC profile. The RC extraction determines a resistance and a capacitance of the RC profile.

Therefore, method 100 generates a simplified RC profile comprising a pattern oriented function that determines a shape of an integrated chip component based upon relations between inputs comprising pattern based graphical features. The simplified RC profile improves the time needed to develop the RC profiles and to maintain the RC profiles.

It has been appreciated that the high level of accuracy needed in RC extractions for middle-of-the-line shapes (e.g., a gate poly layer, a gate contact layer, etc.) typically drives the use of a complex RC profiles that define an integrated chip component as a plurality of separate shapes. The use of pattern oriented functions to define RC profiles within an RC deck simplifies the construction of the RC deck for middle-of-the-line shapes, thereby increasing the RC profile readability, improving RC deck development time, and improving the ease by which updates can be made to the RC profile. This is because the disclosed pattern oriented functions allow for a shape to be defined by a single function, in contrast to traditional RC profiles which use a plurality of separate functions to define a shape. FIGS. 2-5B illustrate some embodiments of method 100 applied to middle-of-the-line shapes.

Figure 2:
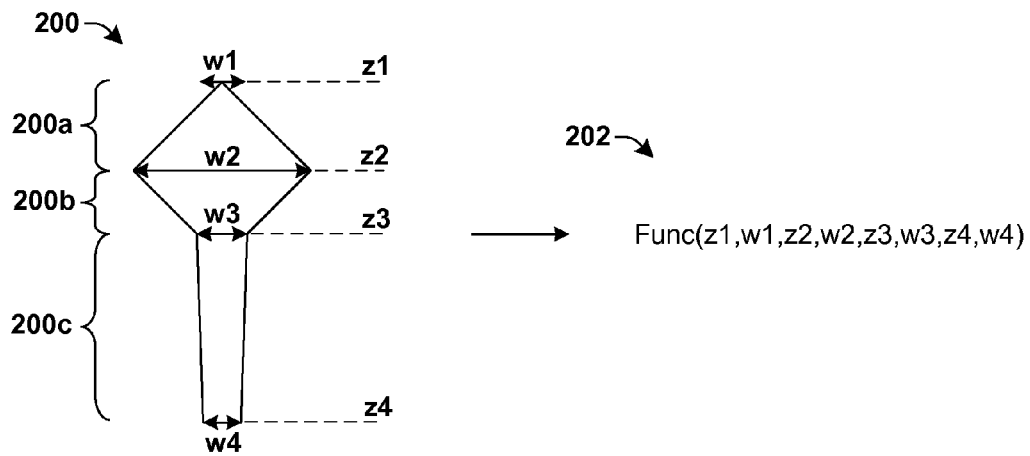
FIG. 2 illustrates some embodiments of the formation of an exemplary pattern oriented function comprising a contact.

FIG. 2 illustrates a block diagram showing some embodiments of the formation of an exemplary pattern oriented function according to method 100, for an integrated chip component comprising a gate contact 200 disposed between a gate region and a first metal interconnect layer.

The physical structure of the gate contact 200 is decomposed into a number of pattern based graphical features that define a physical structure of the gate contact 200. In some embodiments, the pattern based graphical features may comprise a width or a height of the gate contact 200 defined in relation to one or more vertices of the contact. For example, the physical structure of the gate contact 200 may be defined as having a first width w1 at a first height z1 associated with a first vertex, a second width w2 at a second height z2 associated with second and third vertices, a third width w3 at a third height z3 associated with fourth and fifth vertices, and a fourth width w4 at a fourth height z4 associated with sixth and seventh vertices.

A pattern oriented function 202, having inputs comprising one or more of the plurality of pattern based graphical features, is defined to model the gate contact 200. In some embodiments, the pattern oriented function 202 may be configured to take into account process parameters (e.g., etch parameters). In such embodiments, because the pattern oriented function 202 is defined in terms of a shape of the integrated chip component, the shape defined by the pattern oriented function 202 can automatically adjust for etching and other process parameters within the pattern oriented function 202, thereby further simplifying an RC profile.

In some embodiments, the pattern based graphical features are interrelated with one another so that the pattern oriented function 202 defines gate contact 200 based upon relations between the pattern based graphical features. For example, the first width w1 and the second width w2 are interrelated in a manner that defines a pattern corresponding to a first section 200a of the gate contact 200 between the first height z1 and the second height z2. Similarly, the second width w2 and the third width w3 are interrelated in a manner that defines a pattern that corresponds to a second section 200b of the gate contact 200 between the second height z2 and the third height z3, and the third width w3 and the fourth width w4 are interrelated in a manner that defines a pattern that corresponds to a third section 200c of the gate contact 200 between the third height z3 and the fourth height z4. Therefore, the interrelation of the pattern based graphical features allows the pattern oriented function 202 to define the gate contact 200 as a single function.

Figure 3:
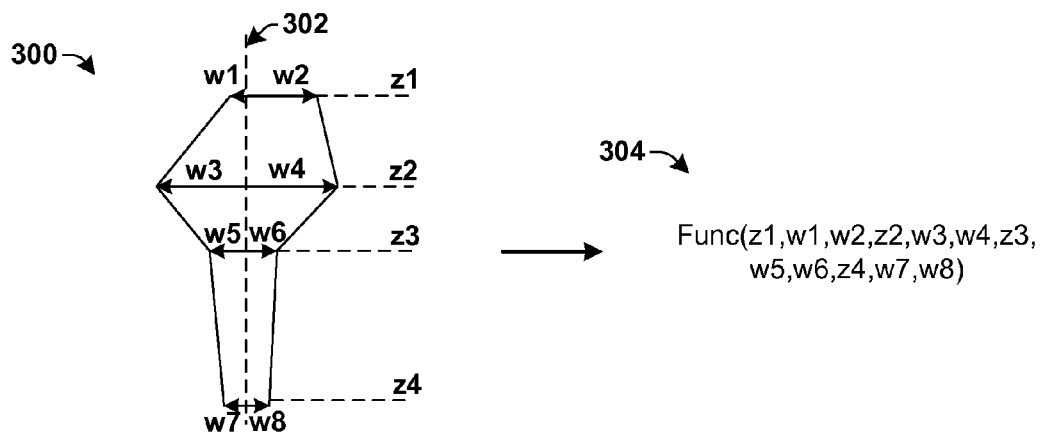
FIG. 3 illustrates some embodiments of the formation of an exemplary pattern oriented function comprising an asymmetric contact.

FIG. 3 illustrates a block diagram showing some embodiments of the formation of an exemplary pattern oriented function according to method 100, for an integrated chip component comprising an asymmetric contact 300.

The physical structure of the asymmetric contact 300 is decomposed into a number of pattern based graphical features that define a physical structure of the asymmetric contact 300 with respect to a center line 302 extending vertically through the asymmetric contact 300. The pattern based graphical features comprise widths w1-w8 of the asymmetric contact 300 defined in relation to heights z1-z4 of different vertices of the asymmetric contact 300.

For example, at a first height z1 the physical structure of the asymmetric contact 300 may be defined as having a first width w1 associated with first vertex and a second width w2 associated with a second vertex. At a second height z2 the physical structure of the asymmetric contact 300 may be defined as having a third width w3 associated with third vertex and a fourth width w4 associated with a fourth vertex. At a third height z3 the physical structure of the asymmetric contact 300 may be defined as having a fifth width w5 associated with fifth vertex and a sixth width w6 associated with a sixth vertex. At a fourth height z4 the physical structure of the asymmetric contact 300 may be defined as having a seventh width w7 associated with seventh vertex and an eighth width w8 associated with an eighth vertex.

By defining a width associated with each vertex relative to the center line 302, the asymmetric contact 300 can be accurately described using a pattern oriented function 304, having inputs comprising the plurality of pattern based graphical features, w1-w8 and z1-z4.

Figure 4:
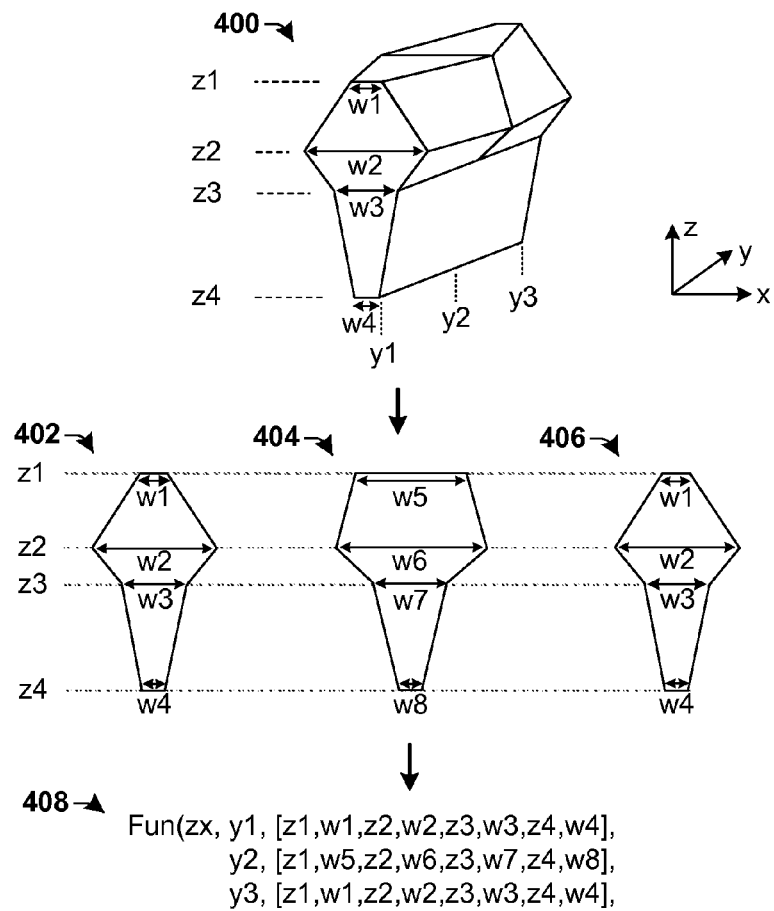
FIG. 4 illustrates some embodiments of the formation of an exemplary pattern oriented function comprising a three dimensional contact.

In some embodiments, to enhance performance the disclosed RC extraction method may be performed as a three-dimensional (3D) extraction having approximations made along multiple axes of a shape to provide for more accurate modeling. FIG. 4 illustrates some embodiments of the formation of an exemplary pattern oriented function comprising a three-dimensional contact 400.

Three-dimensional contact 400 extends along an x-direction, a y-direction, and a z-direction. The three-dimensional contact 400 may be modeled as a plurality of lines extending along the x-direction, the y-direction, and the z-direction, and which intersect one another at vertices.

Cross-sectional views 402-406 describe the three-dimensional contact 400 in terms of its vertices at different locations along the y-direction. For example, cross-sectional view 402 illustrates vertices occurring at a value y1 along the y-direction, cross-sectional view 404 illustrates vertices occurring at a value y2 along the y-direction, and cross-sectional view 406 illustrates vertices occurring at a value y2 along the y-direction.

By defining widths and heights associated with each vertex, the three dimensional contact 400 can be accurately described using a pattern oriented function 408, which has inputs comprising pattern based graphical features y1-y3, w1-w8, and z1-z4.

Figure 5A:
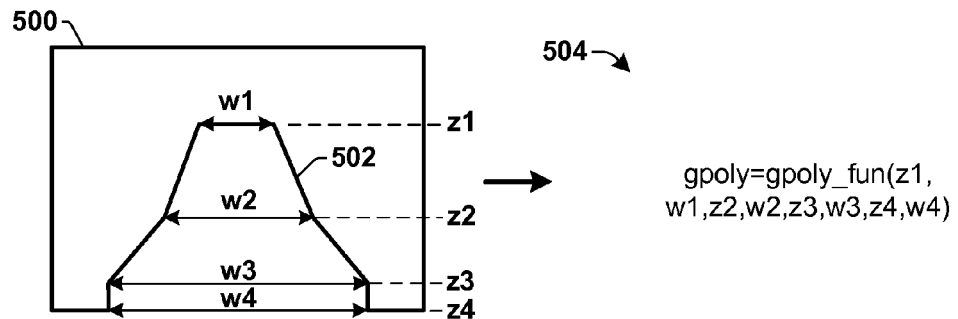
FIG. 5A illustrates some embodiments of the formation of an exemplary pattern oriented function comprising a gate structure.
Figure 5B:
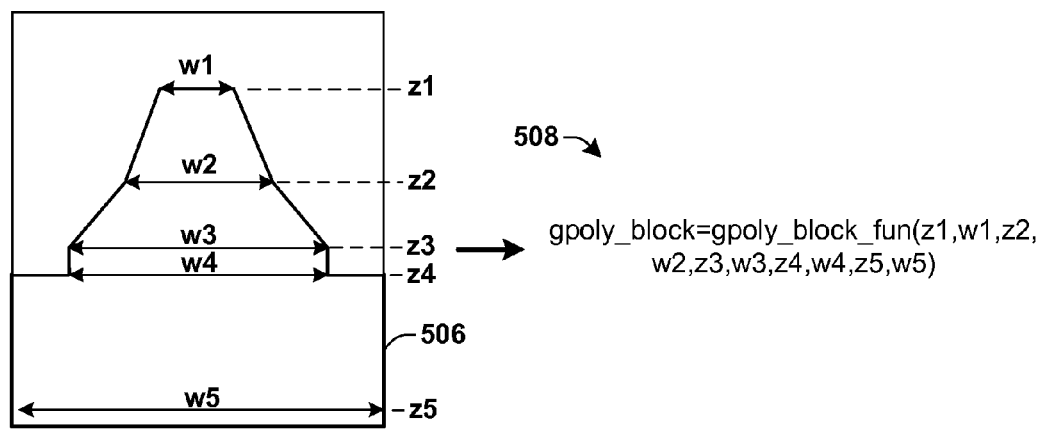
FIG. 5B illustrates some embodiments of the formation of an exemplary pattern oriented function comprising a blocking structure.

FIGS. 5A-5B illustrates some embodiments of pattern oriented functions corresponding different shapes. Although FIGS. 5A and 5B illustrate an inner shape (FIG. 5A) and an outer shape (FIG. 5B) it will be appreciated that these shapes are non-limiting examples of shapes and that in other embodiments, pattern oriented functions may have additional shapes.

FIG. 5A illustrates some embodiments of the formation of an exemplary pattern oriented function comprising a gate structure of a FinFet (Fin field effect transistor) device.

As shown in FIG. 5A, a pattern oriented function 504 is configured to define the gate structure 500 according to an inner shape that uses the pattern based graphical features to determine an inner area 502 that is to be subtracted from a region defined by a preliminary shape determined from a graphical representation of an IC layout (e.g., from a GDS file). By defining the inner shape, an accurate model of the gate structure 500 can be achieved. For example, the pattern oriented function 504 receives inputs comprising a first width w1 at a first height z1, a second width w2 at a second height z2, a third width w3 at a third height z3, and a fourth width w4 at a fourth height z4. Since the widths and heights are used to define the inner area 502 that is to be subtracted, the pattern oriented function 504 can accurately model the inner area 502 and remove it from the preliminary shape to achieve the gate structure 500.

FIG. 5B illustrates a block diagram of some embodiments of pattern oriented function comprising a blocking structure (i.e., a blocking design level). The blocking structure (i.e., also known as a device region) is an area of a device (e.g., the channel region of the FinFet device as well as the substrate below the channel region) in which the capacitance is not extracted during modeling. For example, the capacitance of portions of a conductive element that touch or fall within a blocking region are not extracted during RC extraction. The reason that the blocking region is used is that the capacitance of elements covered by a blocking region are accounted for by models so that RC extraction tools don't need to extract them.

As shown in FIG. 5B, a pattern oriented function 508 is configured to define the blocking structure 506 according to an outer shape that uses using the pattern based graphical features to determine an outer area of the blocking structure 506. For example, the pattern oriented function 508 receives inputs comprising a first width w1 at a first height z1, a second width w2 at a second height z2, a third width w3 at a third height z3, a fourth width w4 at a fourth height z4, and a fifth width w5 at a fifth height z5. Since the widths and heights are used to define the blocking structure 506, the pattern oriented function 508 can accurately model the blocking structure 506.

Figure 6:
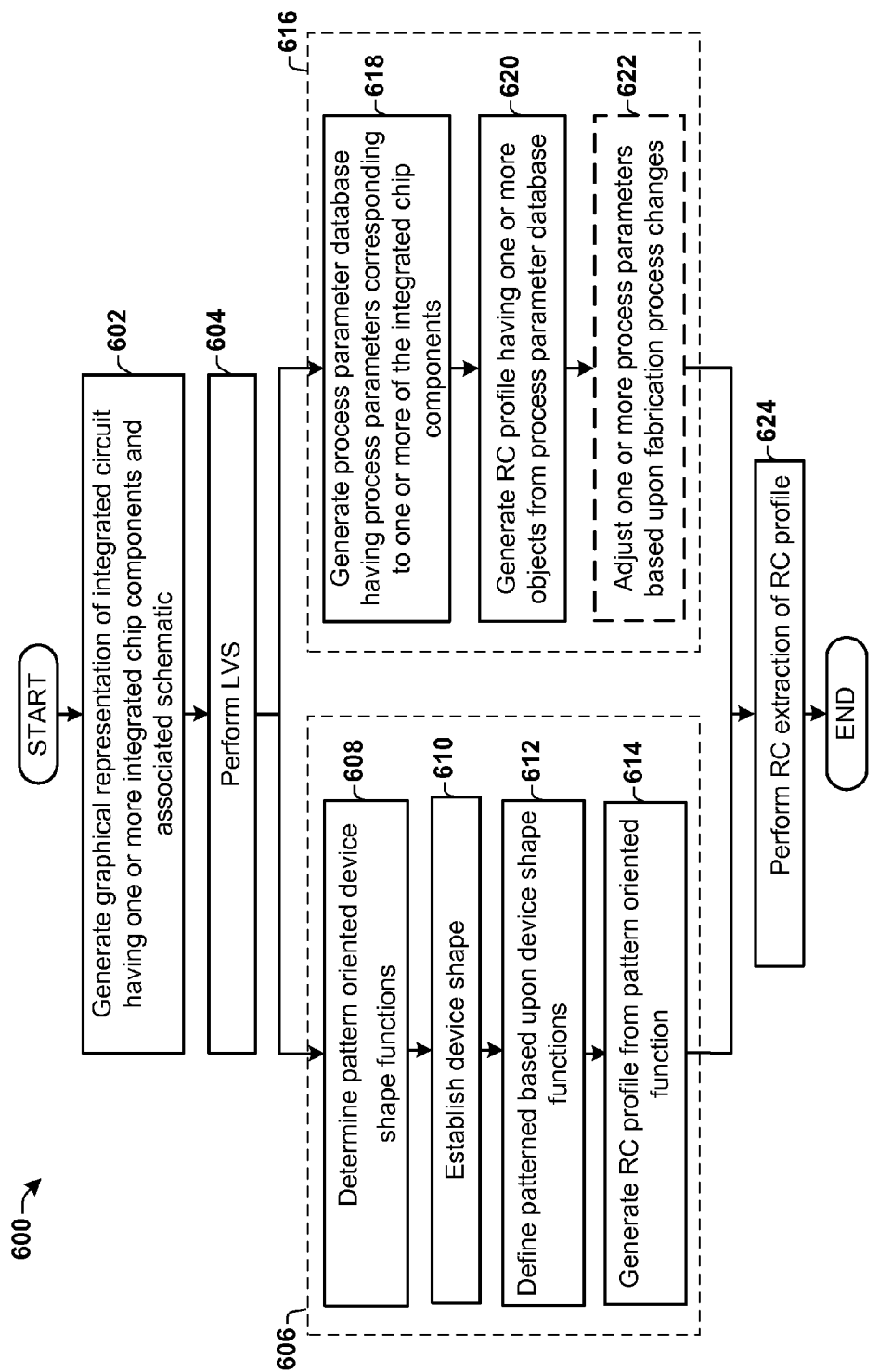
FIG. 6 is a flow diagram of some alternative embodiments of a method of performing an RC extraction.

FIG. 6 is a flow diagram of some alternative embodiments of a method 600 of performing an RC extraction.

While the disclosed methods (e.g., methods 100 and 600) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 602, a graphical representation of an integrated chip layout is provided along with an associated schematic. The graphical representation of the integrated chip layout comprises one or more integrated chip components (e.g., integrated chip components located on MEOL design levels).

At 604 a correspondence of the schematic and the graphical representation is verified with a layout versus schematic (LVS) tool.

In some embodiments, method 600 may proceed to generate an RC profile according to a patterned oriented procedure 606. The pattern oriented procedure 604 determines a shape of an integrated chip component as a pattern oriented function having inputs comprising pattern based graphical features, as described above, as described in acts 608-614.

At 608, one or more pattern based graphical features are determined, which define structural aspects of an integrated chip component.

At 610, a shape of the pattern oriented function may be determined.

At 612, an integrated chip component is defined as a pattern oriented function having inputs comprising the pattern based graphical features.

At 614, RC profile is generated from one or more pattern oriented functions

In other embodiments, method 600 may proceed to generate an RC profile according to a data object procedure 616. The data object procedure 614 generates an RC profile having one or more data objects that reference process parameters stored within a process parameter database, as described in acts 618-622.

At 618, a process parameter database is generated. The process parameter database comprises process parameters corresponding to one or more of the plurality of integrated chip components. For example, the process parameters may comprise etching parameters describing etching effects of a process on a given design level.

At 620, an RC deck comprising a plurality of RC profiles is generated. In some embodiments, one or more of the RC profiles may comprise pattern oriented functions and one or more of the RC profiles may comprise data objects that correspond to the process parameter database.

At 622, values of one or more process parameters within the process parameter database may be adjusted based upon changes to an integrated chip fabrication process. For example, if changes are made to an etching process, one or more process parameters within the process parameter database will be adjusted to account for the changes. The adjustments to the process parameters are automatically made to each data object used within an RC profile.

At 624, an RC extraction is performed on the RC deck. The RC extraction determines a resistance and a capacitance of the RC profile.

Figure 7:
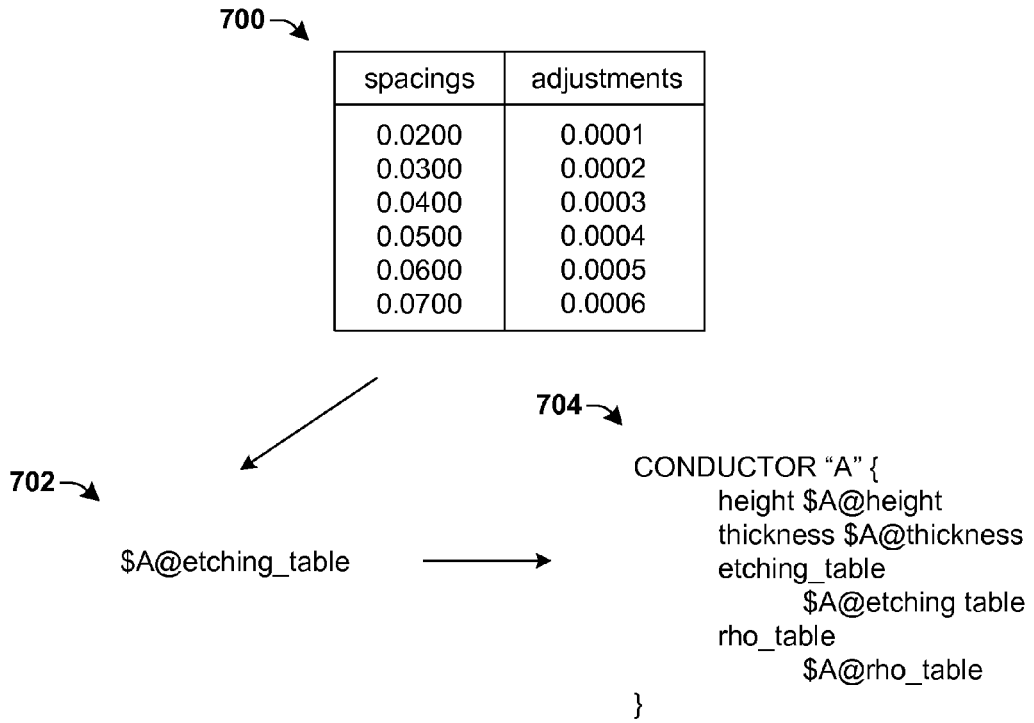
FIG. 7 illustrates some embodiments of an exemplary formation of an RC profile comprising data objects that reference process parameters within a process parameter database.

FIG. 7 illustrates some embodiments of an exemplary formation of an RC profile using data objects corresponding to a process parameter database 700.

Process parameter database 700 comprises one or more process parameters corresponding to an etching process. The process parameter database 700 has a first set of data corresponding to spaces surrounding a shape and a second set of data corresponding to etch adjustments associated with the spaces. For example, a first spacing value of 0.0200 corresponds to a first etching adjustment value of 0.0001, a second spacing value of 0.0300 corresponds to a second etching adjustment value of 0.0002, which is larger than the first etching value. In other embodiments, the process parameters may comprise other parameters such as bias parameters, a height, width, etc.

The process parameters located within the process parameter database 700 are related to a data object 702 that points to the process parameters within the process parameter database 700. The data object 702 can be implemented into an RC profile 704. For example, RC profile 704 comprises a data object $A@etching\_table. The data object incorporates the process parameters of process parameter database 700 into the RC profile 704 without having to actually incorporate the process parameters within the RC profile. In some embodiments, the RC profile 704 may comprise a plurality of data objects. For example, RC profile 704 may comprise data objects corresponding to a height ($A@height), a width ($A@width), etching ($A@etching_table), and bias parameters ($A@rho_table).

By implementing the data object within the RC profile 704, the RC profile comprises the process parameters within the process parameter database 700 without having to actually incorporate the process parameters within the RC profile. This enables process parameters within the process parameter database 700 to be represented in a concise manner that simplifies an RC profile.

It will be appreciated that many metal interconnect layers or devices layer may use the same process parameters (e.g., bias process parameters, etching process parameters, etc.) For example, a first metal interconnect layer and a second metal interconnect layer (located above the first metal interconnect layer) may have a same size formed by a same process having same process parameters. By using a data object to reference the process parameters, the same processes parameters may be easily incorporated within RC profiles of multiple integrated chip components.

Furthermore, the RC profile can be easily updated to take into account changes in the process parameters. For example, if a fabrication process changes, the process parameters can be changed in the process parameter database. By changing the process parameters within the process parameter database the change in process parameters is automatically distributed to RC profiles using the data object, thereby speeding up updates to an RC deck.

Figure 8:
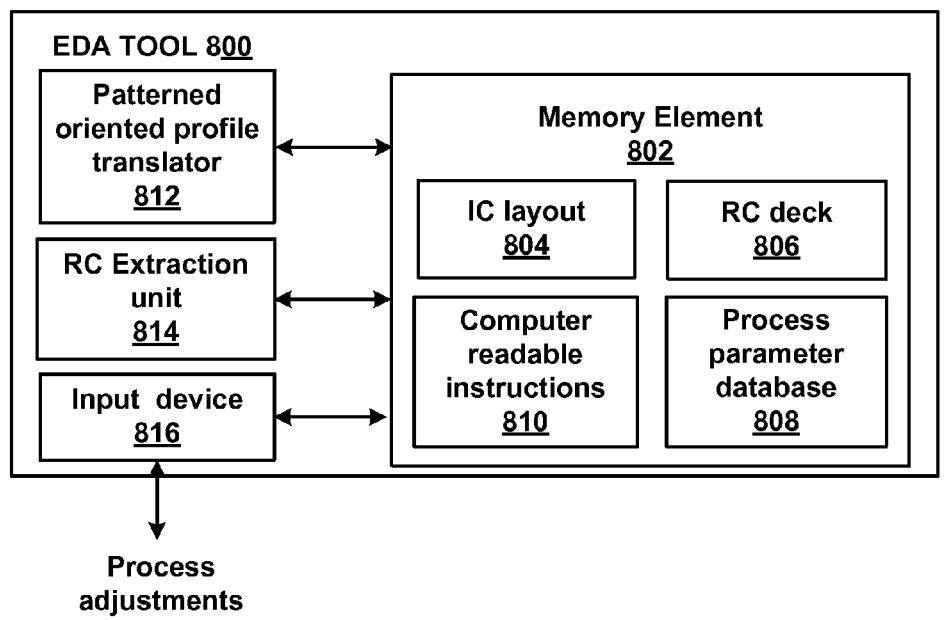
FIG. 8 illustrates a block diagram of an EDA (electronic design automation) tool configured to generate RC profiles according to a disclosed method.

FIG. 8 illustrates some embodiments of an electronic design automation (EDA) tool 800 configured to perform an RC extraction of an RC profile formed by one or more methods disclosed herein.

The EDA tool 800 comprises a memory element 802. In various embodiments, the memory element 802 may comprise an internal memory or a computer readable medium. The memory element 802 is configured to store an integrated chip layout 804 comprising a graphical representation of one or more design layer of an integrated chip. In some embodiments, the IC layout comprise a graphical representation of middle of the line design levels comprising a gate layer, a blocking layer, a gate contact layer, etc. In some embodiments, the memory element 802 may further comprise computer readable instructions 810. The computer readable instructions 810 may provide for a method of performing an RC extraction as disclosed in methods 100 or 600.

A pattern oriented profile translator 812 is configured to interact with the memory element 802. The pattern oriented profile translator 812 is configured to determine one or more pattern based graphical features that define structural aspects of an integrated chip component within the IC layout 804. The pattern oriented profile translator 812 is further configured to define integrated chip component of the IC layout 804 as pattern oriented functions having inputs comprising pattern based graphical features. The pattern oriented functions may be implemented within an RC profile of an RC deck 806 stored in memory element 802. In some embodiments, the RC deck 806 comprises an RC profile of one or more integrated chip structures within the IC layout 804.

An RC extraction unit 814 is configured to operate upon RC deck 806 to extract one or more parasitic parameters of the IC layout 804. For example, the RC extraction unit 814 may extract a capacitance and/or a resistance of one or more integrated chip components of the IC layout 804.

In some embodiments, the memory element 802 may further comprise a process parameter database 808. The process parameter database 808 comprises process parameters corresponding to silicon data (e.g., etching process parameters). In some embodiments, the RC deck comprises one or more RC profiles which contain data objects corresponding to the process parameters stored within the process parameter database 808.

In some embodiments, the EDA tool 800 may further comprise an input device 816. The input device 816 is configured to allow a user to interact with the integrated chip layout 804 and in various embodiments may comprise a keyboard, mouse, and/or any other input device. In some embodiments, the input device 816 is configured to receive process enhancements comprising changes to one or more process parameters. The process enhancements are provided from the input device 816 to the process parameter database 808. By providing the process enhancements to the parameter database 808, data objects within the RC deck can be automatically updated according to the process enhancements without making changes to the RC deck.

It will be appreciated that while reference is made throughout this document to exemplary structures in discussing aspects of methodologies described herein, those methodologies are not to be limited by the corresponding structures presented. Rather, the methodologies and structures are to be considered independent of one another and able to stand alone and be practiced without regard to any of the particular aspects depicted in the Figs.

Also, equivalent alterations and/or modifications may occur to one of ordinary skill in the art based upon a reading and/or understanding of the specification and annexed drawings. The disclosure herein includes all such modifications and alterations and is generally not intended to be limited thereby. For example, although the figures provided herein are illustrated and described to have a particular doping type, it will be appreciated that alternative doping types may be utilized as will be appreciated by one of ordinary skill in the art.

In addition, while a particular feature or aspect may have been disclosed with respect to one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ from that illustrated herein.

Therefore, the present disclosure relates to a method of RC extraction that provides for a fast development time and easy maintenance.

In some embodiments, the present disclosure relates to a method of generating an RC profile. The method comprises generating a graphical representation of an integrated chip layout having a plurality of integrated chip components. The method further comprises determining a plurality of pattern based graphical features, wherein respective pattern based graphical features define a structural aspect of an integrated chip component. The method further comprises defining one of the plurality of integrated chip components as a pattern oriented function having a plurality of inputs comprising one or more of the pattern based graphical features, wherein the pattern oriented function is configured to determine a shape of the one of the plurality of integrated chip components based upon a relation between the plurality of inputs.

In other embodiments, the present disclosure relates to a method of performing an RC extraction. The method comprises generating a graphical representation of an integrated chip layout having a plurality of integrated chip components on middle-of-the-line design levels. The method further comprises determining a plurality of pattern based graphical features, wherein respective pattern based graphical features define a structural aspect of an integrated chip component having a spatial relation with a vertex of an integrated chip component. The method further comprises defining one of the plurality of integrated chip components as a pattern oriented function having a plurality of inputs comprising one or more of the pattern based graphical features, wherein the pattern oriented function is configured to determine a shape of the one of the plurality of integrated chip components based upon a relation between the plurality of inputs. The method further comprises generating an RC (resistance and capacitive) deck having one or more RC profiles comprising the pattern oriented function and extracting resistance and capacitive values from the one or more RC profiles.

In other embodiments, the present disclosure relates to an electronic design automation (EDA) tool. The EDA tool comprises a memory element configured to store a graphical representation of an integrated chip layout having a plurality of integrated chip components. The EDA tool further comprises a pattern oriented translator configured to determine a plurality of pattern based graphical features, wherein respective pattern based graphical features define a structural aspect of an integrated chip component, and to define one of the plurality of integrated chip components as a pattern oriented function having a plurality of inputs comprising one or more of the pattern based graphical features, wherein the pattern oriented function is configured to determine a shape of the one of the plurality of integrated chip components based upon a relation between the plurality of inputs. The EDA tool further comprises an RC extraction unit configured to extract resistance and capacitive values from an RC deck having one or more RC profiles comprising the pattern oriented function.

What is claimed is:

1. A method of generating an RC profile, comprising:
   generating a graphical representation of an integrated chip layout having a plurality of integrated chip components;
   determining a plurality of pattern based graphical features, wherein respective pattern based graphical features define a structural aspect of one of the plurality of integrated chip components; and
   defining the one of the plurality of integrated chip components as a pattern oriented function that is a function of the plurality of pattern based graphical features, wherein the pattern oriented function is configured to determine a cross-sectional shape of the one of the plurality of integrated chip components based upon relations between the plurality of pattern based graphical features;
   wherein a computing device is configured to generate the graphical representation of the integrated chip layout, to determine the plurality of pattern based graphical features, or to define one of the plurality of integrated chip components as the pattern oriented function.

2. The method of claim 1, further comprising:
   generating an RC (resistance and capacitive) deck having one or more RC profiles comprising the pattern oriented function; and
   extracting resistance and capacitive values from the one or more RC profiles.

3. The method of claim 2, further comprising:
   generating a process parameter database comprising process parameters corresponding to the plurality of integrated chip components;
   generating one or more data objects that reference the process parameters within the process parameter database; and
   generating one or more RC profiles within the RC deck that comprise data objects.

4. The method of claim 3, wherein the process parameters comprise etching parameters.

5. The method of claim 3, further comprising:
   adjusting values of one or more process parameters within the process parameter database based upon changes to an integrated chip fabrication process, wherein upon changing the process parameters within the process parameter database the process parameters are automatically updated within the one or more RC profiles comprising the data objects.

6. The method of claim 1, wherein the plurality of pattern based graphical features comprise:
a plurality of height values; and
a plurality of width values, which respectively define a width of the cross-sectional shape at one of the plurality of height values.

7. The method of claim 1, wherein the pattern oriented function is configured to determine a three-dimensional shape of the one of the plurality of integrated chip components based upon relations between the plurality of patterned based graphical features.

8. The method of claim 1, wherein the plurality of pattern based graphical features comprise:
a plurality of height values;
a plurality of width values, which respectively define a width of the cross-sectional shape at one of the plurality of height values; and
a plurality of depth values, which respectively define a depth at one of the plurality of height values and one of the plurality of width values.

9. A method of performing an RC extraction, comprising:
generating a graphical representation of an integrated chip layout having a plurality of integrated chip components on middle-of-the-line design levels;
determining a plurality of pattern based graphical features, wherein the plurality of pattern based graphical features comprise a height value and a corresponding width at the height value of one of the plurality of integrated chip components;
defining the one of the plurality of integrated chip components as a pattern oriented function that is a function of the plurality of pattern based graphical features, wherein the pattern oriented function is configured to determine a cross-sectional shape of the one of the plurality of integrated chip components based upon relations between the plurality of pattern based graphical features;
generating an RC (resistance and capacitive) deck having one or more RC profiles comprising the pattern oriented function; and
extracting resistance and capacitive values from the one or more RC profiles;
wherein a computing device is configured to generate the graphical representation of the integrated chip layout, to determine the plurality of pattern based graphical features, to define one of the plurality of integrated chip components as the pattern oriented function, to generate the RC deck, or to extract the resistance and the capacitive values.

10. The method of claim 9, further comprising:
generating a process parameter database comprising process parameters corresponding to the plurality of integrated chip components;
generating one or more data objects that reference the process parameters within the process parameter database; and
generating one or more RC profiles within the RC deck that comprise data objects.

11. The method of claim 10, wherein the process parameters comprise etching parameters.

12. The method of claim 10, further comprising:
adjusting values of one or more process parameters within the process parameter database based upon changes to an integrated chip fabrication process, wherein upon changing the process parameters within the process parameter database the process parameters are automatically updated within the one or more RC profiles comprising the one or more data objects.

13. The method of claim 9, wherein the pattern oriented function is configured to determine a three-dimensional shape of the one of the plurality of integrated chip components based upon relations between the plurality of patterned based graphical features.

14. The method of claim 9, wherein the plurality of pattern based graphical features comprise:
a plurality of height values;
a plurality of width values, which respectively define a width of the cross-sectional shape at one of the plurality of height values; and
a plurality of depth values, which respectively define a depth at one of the plurality of height values and one of the plurality of width values.

15. An electronic design automation (EDA) tool, comprising:
a memory element configured to store a graphical representation of an integrated chip layout having a plurality of integrated chip components;
a pattern oriented translator configured to:
determine a plurality of pattern based graphical features, wherein respective pattern based graphical features define a structural aspect of one of the plurality of integrated chip components;
define the one of the plurality of integrated chip components as a pattern oriented function that is a function of the plurality of pattern based graphical features, wherein the pattern oriented function is configured to determine a cross-sectional shape of the one of the plurality of integrated chip components based upon relations between the plurality of pattern based graphical features; and
an RC extraction unit configured to extract resistance and capacitive values from an RC deck having one or more RC profiles comprising the pattern oriented function.

16. The EDA tool of claim 15, wherein respective pattern based graphical features have a spatial relation with vertices of an integrated chip component.

17. The EDA tool of claim 15, wherein the plurality of integrated chip components comprise components on a gate structure design level, a blocking design level, or a gate contact design level.

18. The EDA tool of claim 15, further comprising:
a process parameter database comprising process parameters corresponding to the plurality of integrated chip components,
wherein the RC deck comprises one or more RC profiles that comprise data objects that reference the process parameters within the process parameter database.

19. The EDA tool of claim 18, wherein the process parameters comprise etching parameters.

20. The EDA tool of claim 18, further comprising:
an input device configured to receive parameters corresponding to adjustments in an integrated chip fabrication process and to adjust one or more of the process parameters within the process parameter database,
wherein upon changing the process parameters within the process parameter database the process parameters are automatically updated within the one or more RC profiles comprising the data objects.

21. The EDA tool of claim 15, wherein the plurality of pattern based graphical features comprise:
a plurality of height values; and a plurality of width values, which respectively define a width of the cross-sectional shape at one of the plurality of height values.

22. The EDA tool of claim 15, wherein the plurality of pattern based graphical features comprise:
   a plurality of height values;
   a plurality of width values, which respectively define a width of the cross-sectional shape at one of the plurality of height values; and
   a plurality of depth values, which respectively define a depth at one of the plurality of height values and one of the plurality of width values.

\* \* \* \* \*